United States Patent [19]

Edinger et al.

[11] Patent Number: 4,674,161
[45] Date of Patent: Jun. 23, 1987

[54] CONNECTION METHOD FOR PIEZO-ELECTRIC ACOUSTIC TRANSDUCERS IN ELECTRO-ACOUSTIC CAPSULES

[75] Inventors: Egon Edinger, Krailling; Friedrich Pedall, Munich, both of Fed. Rep. of Germany

[73] Assignee: Siemens Aktiengesellschaft, Berlin and Munich, Fed. Rep. of Germany

[21] Appl. No.: 719,467

[22] Filed: Apr. 3, 1985

[30] Foreign Application Priority Data

Apr. 11, 1984 [DE] Fed. Rep. of Germany ....... 3413697

[51] Int. Cl.⁴ ...................... H01L 41/22; H04R 31/00
[52] U.S. Cl. ..................................... 29/25.35; 29/594; 310/324; 381/190
[58] Field of Search ............... 29/25.35, 594; 310/324; 381/114; 179/110 A, 110 D

[56] References Cited

U.S. PATENT DOCUMENTS 3,331,970 7/1967 Dundon et al. ................ 179/110 A
3,879,726 4/1975 Sweany ........................... 29/25.35 X
4,190,784 2/1980 Massa ......................... 179/110 A X

FOREIGN PATENT DOCUMENTS 2020921 11/1979 United Kingdom .

Primary Examiner—Carl E. Hall
Attorney, Agent, or Firm—Hill, Van Santen, Steadman & Simpson

[57] ABSTRACT

A piezo-electric acoustic transducer has two strip-shaped terminal leads for connection of an acoustic-electric transducer plate to an amplifier assembly of the microphone. Previously the two leads were manually soldered to Griplet soldering rivets on the component side of the circuit boards with the addition of soldering tin, and were insulated from the housing by means of an insulating ring. In the present invention, the terminal strips are directly soldered to the connector paths of a flat amplifier assembly and are electrically insulated from the housing by means of a tab. With this type of automated soldering and insulation, a work piece carrier is provided with a plurality of devices for the mounting of the flat assembly on the carrier plate.

13 Claims, 7 Drawing Figures

CONNECTION METHOD FOR PIEZO-ELECTRIC ACOUSTIC TRANSDUCERS IN ELECTRO-ACOUSTIC CAPSULES

BACKGROUND OF THE INVENTION

The invention relates to piezo-electric acoustic transducers for electro-acoustic capsules with two terminal elements in the form of strip-shaped terminal leads or wires for the transducer. One of the leads is contacted to an adhesive-side electrode of piezo-ceramic, and the second lead is soldered onto the other electrode. The invention further relates to devices for soldering the terminal leads onto the conductor paths of a flat amplifier assembly and for mounting this flat assembly on the carrier plate.

Piezo-electric acoustic transducers are installed in telephone devices, preferably in mouth-pieces (microphones), ear-pieces, and ringing capsules. With the exception of an ear-piece type, the transducer always has two terminal strips: one strip is contacted through to the adhesive-side electrode of the piezo-ceramic (see German OS No. 28 20 403, corresponding to British Patent No. 2,020,921, incorporated herein by reference) and the second of which is soldered to the other electrode.

Previously the two terminal leads of the transducer plate have been manually soldered to Griplet soldering rivets on the components side of the circuit board with the addition of soldering tin. For this purpose the separating plate, the silicon rings, the transducer plate, the carrier and the amplifier assembly must be pre-assembled. The application of a synthetic ring prevents an electric short-circuit occurring between the metal housing and the terminal leads. This assembly and soldering procedure is expensive, fault prone, and cannot be automated.

FIG. 1 illustrates the previous construction of a mouth-piece. Reference numeral 1 designates the housing under the surface of which there is arranged a damping ring 2. Beneath the damping ring is arranged a separating plate 3 as a structural support element. The transducer is formed of a transducer plate 4 comprising electrically conductive material, and of a disc of piezo-ceramic which is provided with electrodes on both its sides and over its entire surface. The piezo-ceramic, which is provided with the electrodes, is permanently connected to the transducer plate 4 by adhesive. The transducer plate 4 is supported by two silicon rings 5a and 5b. The through-contacted terminal lead or strip is not represented in the illustrated sectional plane. The soldered-on terminal lead 6 is guided between the transducer plate 4 and silicon ring 5, and between a synthetic carrier 7 and the metal housing 1 to the component side of an amplifier assembly 9 where it is soldered to Griplet soldering rivets 8. Reference numeral 10 designates a synthetic ring which protects the two terminal leads or strips from the metal housing of the piezo-microphone so as to prevent a short-circuit. An insulating body 11 is arranged in the lower region of the housing.

SUMMARY OF THE INVENTION

An object of the invention is to improve upon the piezo-electric-acoustic transducer which has been defined in the introduction and has been illustrated in FIG. 1 in such a manner as to permit a fully automated soldering of the two striplike terminal leads of the acoustic-electric transducer plate to the amplifier assembly of the microphone. In addition, the terminal leads are to be insulated from the metal housing so as to prevent a short-circuit by means of a tab 10a in place of the synthetic ring.

As illustrated in FIG. 2, this object is realized in that those ends of the terminal leads which are not connected to the transducer plate are bent on to conductor paths of a flat amplifier assembly. This ensures that the previously required, expensive Griplet soldering rivets and likewise the silicon adhesive required for the fixing of the terminal leads can be dispensed with. The addition of soldering tin and flux agent during the soldering process are also no longer required, since the tin applied during the surge process and the residues of the flux agent are adequate for the soldering process.

In accordance with a further development of the invention, the terminals for the leads permit a tolerance range for the soldering.

This type of automated soldering of the terminal leads necessitates a modified assembly sequence in accordance with the invention which is possible only with the assistance of a workpiece carrier and a corresponding workpiece holder. Here the separating plate is fixed in the required workpiece carrier in such manner that the conductor path side is freely accessible. Silicon rings and a transducer plate are likewise pre-assembled on the workpiece carrier. The two terminal leads intersect the conductor path to which the leads are soldered. With the assistance of two temperature regulated U-shaped soldering devices the leads are soldered in a reflow soldering process. Then the carrier is pressed from above on to the amplifier assembly. The amplifier assembly and carrier are pivoted and pressed into the separating plate.

In a further operating process, in accordance with the invention the two terminal leads are protected from the metal housing of the piezo-microphone so as to prevent a short-circuit by means of an automatically applied tab.

DESCRIPTION OF THE PREFERRED EMBODIMENTS

Figure 1:
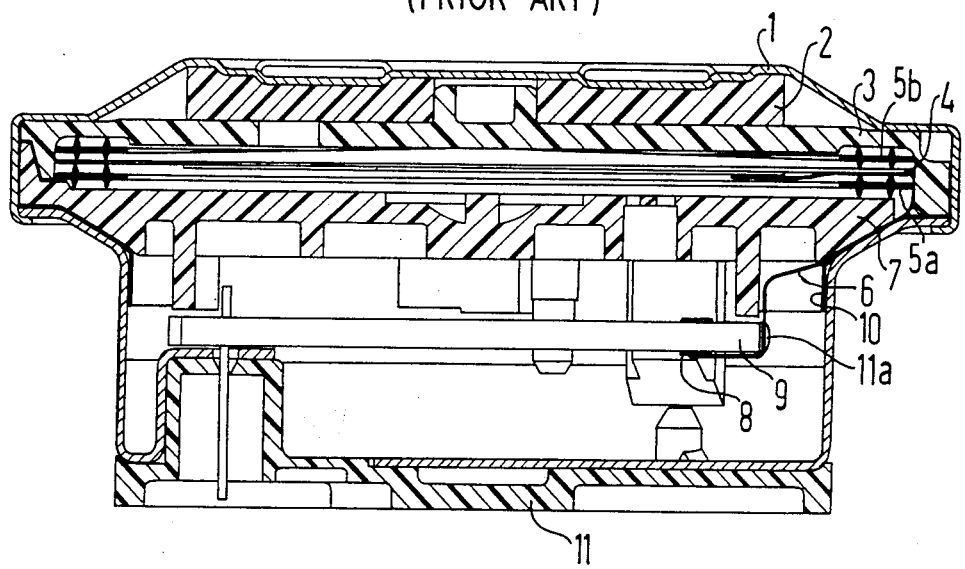
FIG. 1 illustrates the known piezo-transducer microphone in section.

As already stated, FIG. 1 is a section through a transistor microphone in which the terminal leads are contacted via Griplet soldering rivets 8 to the flat assembly 9.

Figure 2:
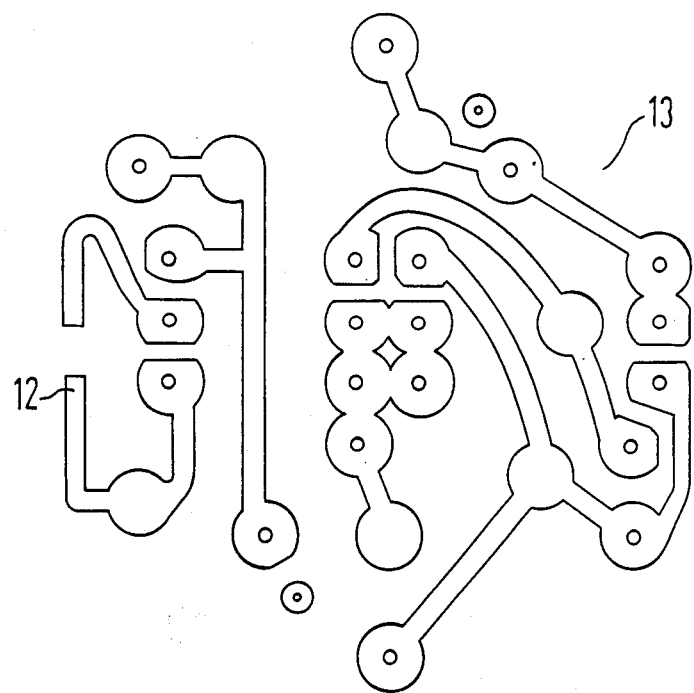
FIG. 2 represents the conductor path side of the flat amplifier assembly.

The left-hand part of FIG. 2 shows the conductor paths 12 to which the terminal leads can be soldered in a specific tolerance range.

Figure 3:
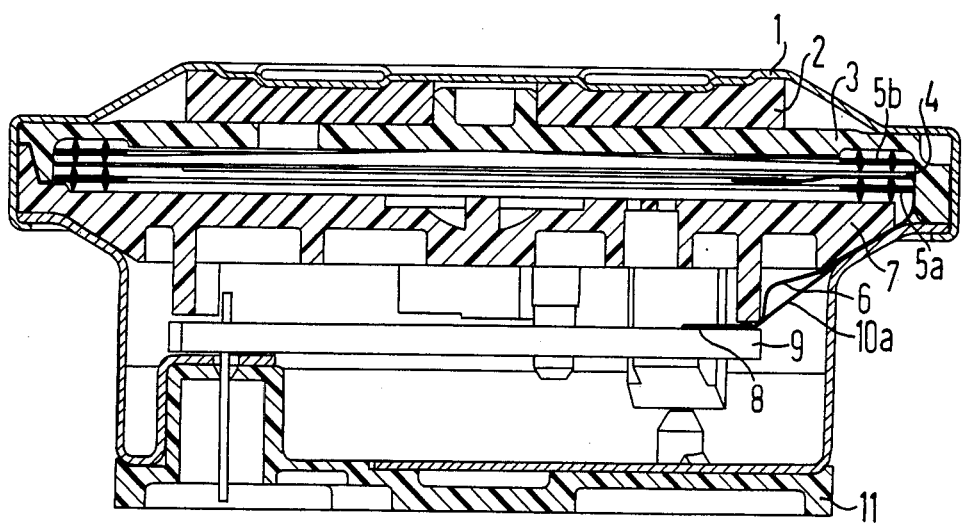
FIG. 3 is a cross-section of a transducer microphone capsule with terminal leads soldered to the conductor path and with insulating tab.

FIG. 3 differs from FIG. 1 by virtue of the omission of the Griplet soldering rivets 8 and the contacting of the leads to the conductor paths 12. Also shown is the adhesive tab 10a which serves to insulate the leads from the metal housing.

Figure 4:
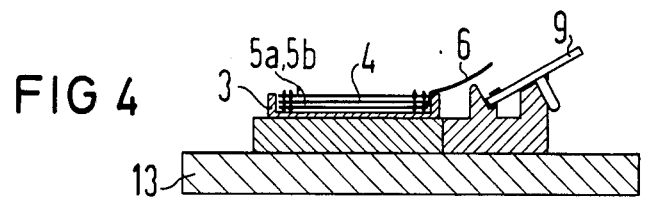
FIG. 4 illustrates a work piece carrier which accommodates the unit consisting of structural support elements and transducer plate and flat amplifier assembly.

FIG. 4 schematically illustrates the pre-assembly. A workpiece carrier 13 encompasses the unit formed of the structural support elements, the separating plate 3, the silicon rings 5a and 5b, and the transducer plate 4 with terminal leads 6. The right-hand part of the workpiece carrier is designed to accommodate the flat amplifier assembly 9.

Figure 5:
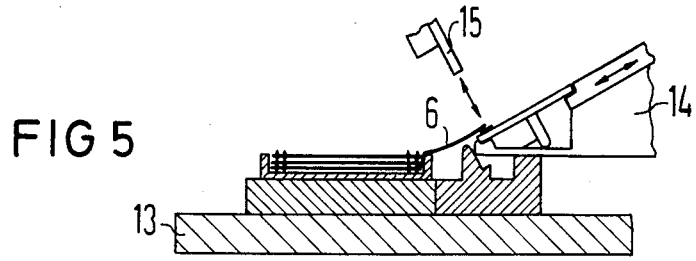
FIG. 5 illustrates the device shown in FIG. 4 with the addition of a lifting device and reflow soldering head.

In contrast to FIG. 4, FIG. 5 additionally represents a lifting device 14 which lifts the amplifier assembly into the soldering position. Also shown is a reflow soldering head 15.

Figure 6:
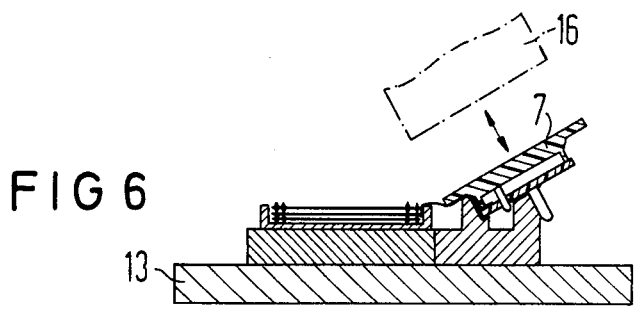
FIG. 6 shows, as a supplement to FIG. 4, a carrier supply device and carrier assembly ram.

In contrast to FIG. 4, FIG. 6 additionally illustrates the carrier supply and assembly ram 16 in the lifted position following the positioning of the carrier.

Figure 7:
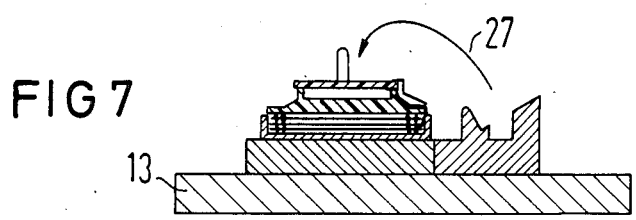
FIG. 7 illustrates the partially assembled transistor microphone following a pivoting and assembly process by means of an additional device (not shown).

FIG. 7 schematically illustrates an additional device by which the carrier 7, with the flat amplifier assembly 9, is pivoted in the direction of the arrow 27 and mounted into the unit formed of the structural support elements and the transducer plate 4.

The assembly process proceeds, for example, as follows.

In a station of a transfer path, the workpiece carrier 13 is equipped with the unit consisting of the structural support elements and the amplifier assembly (FIG. 4). This process can take place automatically. In a further transfer station—the soldering station (FIG. 5)—the flat amplifier assembly is lifted into the soldering position by means of an additional device in order to assume the lead position necessary for the later assembly, the reflow soldering head 15 being lowered on to the soldering position and the soldering of the terminal leads to the conductor paths being carried out automatically under time and temperature control. Then the flat amplifier assembly is lowered again into the workpiece carrier.

In a next station (FIG. 6), the carrier supply and assembly ram is made available and is automatically pressed onto the flat amplifier assembly via support studs.

Following further transportation into a new transfer station (FIG. 7), the unit consisting of the carrier with the flat amplifier assembly is pivoted therein with the assistance of an additional device and is mounted into the unit consisting of the structural support elements and the transducer plate.

The conclusion of the process is carried out in a further station (not shown) in which the tab 10a which serves to insulate the leads is automatically applied by means of adhesive.

Although various minor changes and modifications might be suggested by those skilled in the art, it will be understood that we wish to include within the claims of the patent warranted hereon all such changes and modifications as reasonably come within our contribution to the art.

We claim as our invention:

1. A method for assembly of a piezo-electric acoustic transducer unit, comprising the steps of:
   providing an amplifier assembly comprising a printed circuit board with first and second conductor path segments on one surface thereof;
   providing a piezo-electric acoustic transducer having first and second terminal leads electrically contacting a piezo-ceramic element of the transducer;
   providing a work piece carrier adapted for receiving the amplifier assembly so that the conductor path segments are facing upwardly and accessible to a soldering apparatus having soldering head;
   placing the amplifier assembly on the work piece carrier;
   bring the soldering head down into contact with the terminal lead ends and soldering the lead ends onto the respective connector path segments;
   after soldering the terminal leads onto the conductor path segments, placing a carrier onto the amplifier assembly on the side having the conductor path segments;
   providing the work piece carrier so that it also supports a structural support element containing the transducer, and positions it alongside the amplifier assembly; and
   flipping the carrier and amplifier assembly over onto the support element containing the transducer.

2. A method according to claim 1 including the step of: providing the workpiece carrier so that it holds the amplifier assembly at a specific angle relative to a structural support element for receiving the transducer.

3. A method according to claim 1 including the step of providing the work piece carrier with a device for supporting the transducer plate alongside the amplifier assembly in its position with the conductor path segments facing the soldering apparatus.

4. A method according to claim 1 wherein a reflow soldering device is provided for contacting the ends of the terminal leads against the circuit board conductor path segments.

5. A method according to claim 1 including the step of mounting a carrier onto the amplifier assembly by an assembly ram.

6. A method according to claim 1 including the steps of assembling a carrier to the amplifier assembly, and flipping the carrier with attached amplifier assembly over onto a structural support element containing the transducer.

7. A method according to claim 6 including the step of providing the structural support element with the transducer in a metal housing and arranging an insulating tab between the two terminal leads and the metal housing.

8. A method according to claim 7 wherein the tab comprises an adhesive tab.

9. A method according to claim 1 wherein the terminal leads comprise flat strips.

10. A method according to claim 1 including the steps of:
   before bringing the soldering head down into contact with the terminal lead ends, lifting the amplifier assembly with a lifting device towards the soldering head and bringing the soldering head into contact with the terminal lead ends while the amplifier assembly is lifted.

11. A method for assembling a piezo-electric acoustic transducer, comprising the steps of:
   providing an electro-acoustic transducer having first and second terminal leads extending therefrom;
   providing a work piece carrier, and placing on the work piece carrier a support element with the transducer thereon;

also on the work piece carrier and alongside the transducer providing an element for supporting an amplifier assembly, said amplifier assembly having first and second conductor path segments facing a soldering apparatus;

soldering ends of the first and second terminal leads not connected to the transducer plate to the first and second conductor path segments;

assembling a carrier onto the amplifier assembly;

flipping the carrier and amplifier assembly over onto the transducer and support element; and placing the transducer and amplifier assembly in a housing.

12. A method according to claim 11 wherein the housing comprises metal and an insulating tab is placed between at least one of the terminal leads and the metal housing.

13. A method according to claim 11 including the step of:

before soldering ends of the first and second terminal leads to the first and second conductor path segments, lifting the amplifier assembly with a lifting device towards the soldering head and bringing the soldering head into contact with the terminal lead ends while the amplifier assembly is lifted.

* * * * *